(12) United States Patent
Tiziani et al.

(10) Patent No.: US 11,626,379 B2
(45) Date of Patent: Apr. 11, 2023

(54) METHOD OF MANUFACTURING SEMICONDUCTOR DEVICES AND CORRESPONDING SEMICONDUCTOR DEVICE

(71) Applicant: STMICROELECTRONICS S.r.l., Agrate Brianza (IT)

(72) Inventors: Roberto Tiziani, Nerviano (IT); Guendalina Catalano, Augusta (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/199,340

(22) Filed: Mar. 11, 2021

(65) Prior Publication Data
US 2021/0305191 A1    Sep. 30, 2021

(30) Foreign Application Priority Data
Mar. 24, 2020    (IT) .................. 102020000006223

(51) Int. Cl.
*H01L 23/00* (2006.01)
*H01L 21/56* (2006.01)
*H01L 23/495* (2006.01)

(52) U.S. Cl.
CPC ............ *H01L 24/19* (2013.01); *H01L 21/561* (2013.01); *H01L 23/49503* (2013.01);
(Continued)

(58) Field of Classification Search
CPC ... H01L 21/0405; H01L 24/19; H01L 21/561; H01L 23/49503; H01L 24/24; H01L 24/96
See application file for complete search history.

(56) References Cited

U.S. PATENT DOCUMENTS 9,171,739 B1    10/2015 Roh et al.
2002/0102745 A1    8/2002 Lahiri et al.
(Continued)

FOREIGN PATENT DOCUMENTS

GB    2 313 713 A    12/1997
JP    2009-16711 A    1/2009
(Continued)

OTHER PUBLICATIONS

"Supplementary: Customised Lead-Frame", accessed on Jun. 26, 2017, 10 pages, at http://www.mtarr.co.uk/courses/topics/0264_csp/supplementary/sup_01.html.
(Continued)

*Primary Examiner* — Mohammad M Choudhry
(74) *Attorney, Agent, or Firm* — Seed IP Law Group LLP

(57) ABSTRACT

A method comprises molding laser direct structuring material onto at least one semiconductor die, forming resist material on the laser direct structuring material, producing mutually aligned patterns of electrically-conductive formations in the laser direct structuring material and etched-out portions of the resist material having lateral walls sidewise of said electrically-conductive formations via laser beam energy, and forming electrically-conductive material at said etched-out portions of the resist material, the electrically-conductive material having lateral confinement surfaces at said lateral walls of said etched-out portions of the resist material.

21 Claims, 6 Drawing Sheets

(52) U.S. Cl.
CPC .............. *H01L 24/24* (2013.01); *H01L 24/96* (2013.01); *H01L 2224/24175* (2013.01)

(56) References Cited

U.S. PATENT DOCUMENTS

| | | | |
|---|---|---|---|
| 2012/0120623 A1 | 5/2012 | Baek et al. | |
| 2015/0021754 A1 | 1/2015 | Lin et al. | |
| 2015/0279778 A1 | 10/2015 | Camacho et al. | |
| 2016/0100256 A1 | 4/2016 | Watson et al. | |
| 2016/0183369 A1* | 6/2016 | Talledo | H05K 1/181 361/767 |
| 2017/0077043 A1 | 3/2017 | Takemura et al. | |
| 2017/0367182 A1 | 12/2017 | Wu et al. | |
| 2018/0053731 A1* | 2/2018 | Sommer | H05K 9/0045 |
| 2018/0342433 A1 | 11/2018 | Ziglioli et al. | |
| 2018/0342453 A1 | 11/2018 | Ziglioli | |
| 2019/0115287 A1 | 4/2019 | Derai et al. | |
| 2020/0161206 A1* | 5/2020 | Hu | H01L 23/5386 |
| 2020/0185293 A1* | 6/2020 | Schmalzl | H01L 21/4846 |
| 2021/0013134 A1 | 1/2021 | Derai et al. | |

FOREIGN PATENT DOCUMENTS

| | | |
|---|---|---|
| JP | 2009-81208 A | 4/2009 |
| WO | 2015003175 A1 | 1/2015 |

OTHER PUBLICATIONS

2019/0115287, Apr. 18, 2019.
2021/0013134, Jan. 14, 2021.

* cited by examiner

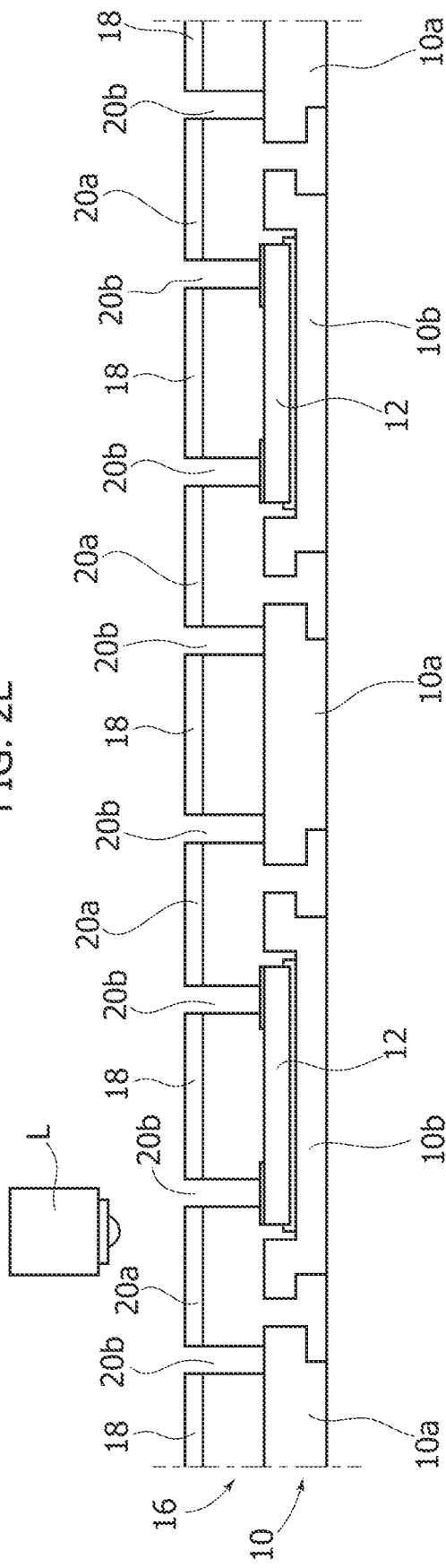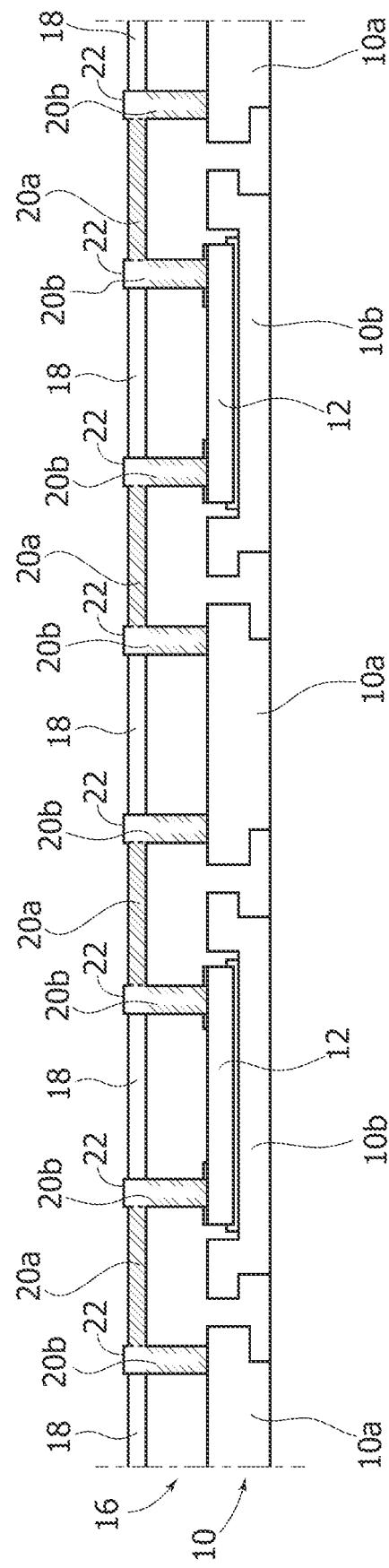

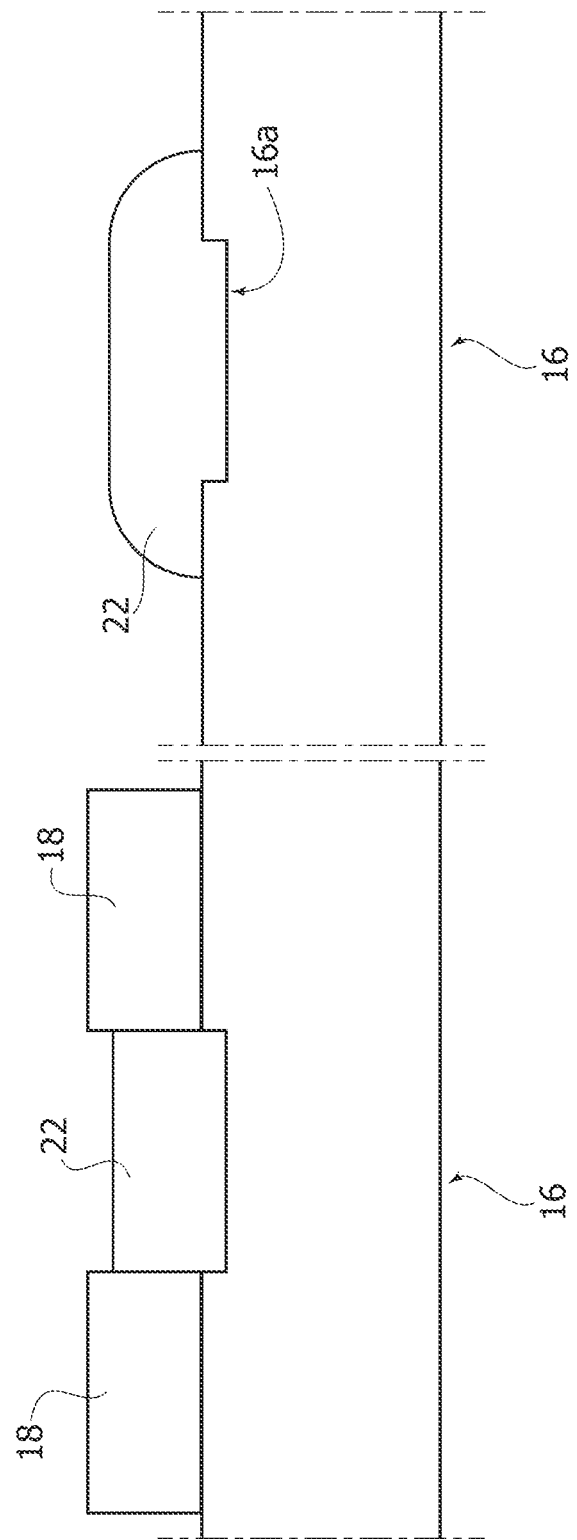

METHOD OF MANUFACTURING SEMICONDUCTOR DEVICES AND CORRESPONDING SEMICONDUCTOR DEVICE

BACKGROUND

Technical Field

The present disclosure relates to embodiments of methods of manufacturing semiconductor devices, which may be applied to manufacturing semiconductor devices such as integrated circuits (ICs).

Description of the Related Art

Manufacturing semiconductor devices (e.g., integrated circuits (ICs)) is an area of technology, which has attracted extensive research activity.

Despite the extensive research activity in this area of manufacturing semiconductor devices, further improved solutions are desirable.

BRIEF SUMMARY

The object of one or more embodiments of the present disclosure is to contribute in providing improved solutions in the manufacture of semiconductor devices.

One or more embodiments may provide various types of improvements in semiconductor device packages.

For instance, one or more embodiments may facilitate:
preventing copper (Cu) growth laterally of electrically-conductive formations in electroplating process;
obtaining Cu growth over the surface of a laser direct structuring (LDS) material with substantially vertical edges;
reducing the pitch of Cu tracks, meeting design constraints of 25/25 μm line/space, for instance.

One or more embodiments may be used on QFN (Quad-Flat No-lead), BGA (Ball Grid Array)/LGA (Land Grid Array) or QFP (Quad Flat Package or Pack) packages. QFN (Quad-Flat No-lead) is a package type with a metallic leadframe with flat leads fully incorporated in a molding compound. BGA/LGA is a package type characterized by solder ball/land incorporated in a molding compound made with organic substrate. QFP is a package type with metallic leadframe and gull wing leads.

BRIEF DESCRIPTION OF THE SEVERAL VIEWS OF THE DRAWINGS

It will be appreciated that for the sake of clarity and ease of understanding the various figures may not be drawn to a same scale.

One or more embodiments will now be described, by way of example only, with reference to the figures, wherein:

FIGS. 2A to 2J are exemplary of possible acts or steps in embodiments of the present disclosure or within the scope of the present disclosure; and FIG. 3 is a cross-sectional view of an electrically-conductive formation in one or more embodiments of the present disclosure or within the scope of the present disclosure.

DETAILED DESCRIPTION

Figure 1:
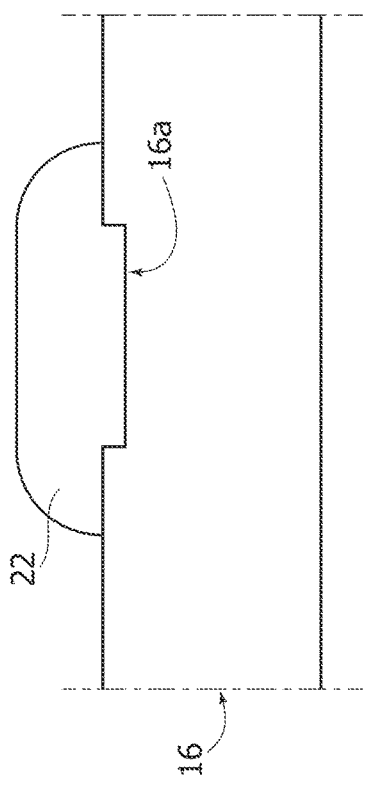
FIG. 1 is a cross-sectional view of an electrically-conductive formation with lateral Cu growth.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment," "in one embodiment," or the like, that may be present in various points of the present description do not necessarily refer exactly to one and the same embodiment. Furthermore, particular conformations, structures, or characteristics may be combined in any adequate way in one or more embodiments.

The terms "vertical," "upper," and "bottom," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The headings/references used herein are provided merely for convenience and hence do not define the extent of protection or the scope of the embodiments.

In semiconductor device manufacturing, electrical connection between leadframes or substrates and semiconductor chips or dice arranged thereon can be provided in the form of metal wiring (so-called wire-bonding technology may be exemplary of such an approach).

An insulating compound (an epoxy molding compound, for instance) can be molded onto a leadframe or substrate to encapsulate a semiconductor die or dice arranged thereon.

Recent developments in that area (as witnessed by documents such as US 2018/342433 A1, US 2018/342453 A1 or US 2019/115287 A1, for instance) disclose the possibility of using for that purpose an additive molding compound, e.g., laser direct structuring (LDS) material.

Laser direct structuring (LDS) is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins which include additives suitable for the LDS process; a broad range of resins such as polymer resins like PC (polycarbonate), PC/ABS (Acrylonitrile Butadiene Styrene), ABS, and LCP (liquid crystal polymer) are currently available for that purpose.

In LDS, a laser beam can be used to transfer a desired electrically-conductive pattern onto a plastic molding which may then be subjected to metallization (for instance via electroless plating with copper or other metals) to finalize a desired conductive pattern.

For instance, once electrically-conductive formations, such as lines or vias, are structured in an LDS material "activated" via a laser beam, electrical conductivity of these formation can be facilitated by forming electrically-conductive material thereon. This may involve, for instance, forming a thin film by immersion into a copper (Cu) electroless bath, followed by galvanic Cu growth, this resulting in thick Cu tracks formed which connect the semiconductor die or dice and the leads.

The electrically conductive formations 20a, 20b and the electrically conductive material may be referred to as an electrically conductive structure, which has a U-shape like structure as shown in FIGS. 2G-2J.

Direct copper interconnection has been regarded as hardly applicable to devices with fine pitch, that is with reduced spacing between adjacent electrically-conductive formations. Galvanic Cu growth is essentially isotropic and may thus imply lateral Cu growth over the electrically-conductive formations.

This is exemplified in FIG. 1 where reference numeral 16 denotes a substrate having a recessed portion 16a formed therein. This may be the case of a substrate of an LDS material exposed to laser beam activation energy to structure therein an electrically-conductive formation (a conductive line, for instance) at 16a. Reference 22 denotes an electrically-conductive (e.g., Cu) track or trace formed at 16a as discussed previously, and thus exhibiting some sort of lateral growth.

Such lateral growth places a constraint on the gap between adjacent conductive formations: in fact, too close a spacing may lead to undesired contact (short circuit) between adjacent formations.

Consequently, applying conventional LDS technology as discussed so far to provide such formations (tracks or vias, for instance) involves designing such formations with a separation (pitch) wide enough to facilitate avoiding undesired contact between adjacent formations after Cu plating.

For instance (of course these figures are purely exemplary and non-mandatory) a conductive track having a width of 80 μm (resulting from laser beam activation of the LDS material) may eventually become 180 μm wide as a result of a 50 μm Cu lateral growth at each side of a track having 50 μm Cu plating growth.

Conventional LDS technology as discussed so far is thus hardly applicable to "fine pitch" tracks or traces as desirable in application such as, for instance, smart power silicon technology, e.g., with 20 μm (minimum) laser spot and thick Cu plating.

It is also observed that conventional LDS technology as discussed so far may lead to Cu spikes formed at corners or at vias due to uneven current density.

One or more embodiments may facilitate preventing lateral Cu growth over electrically-conductive formations.

In one or more embodiments, Cu tracks resulting from Cu growth over electrically-conductive formations may have substantially vertical edges.

FIGS. 2A to 2J are exemplary of various acts which may be implemented in fabricating semiconductor products 100.

Figure 2A:
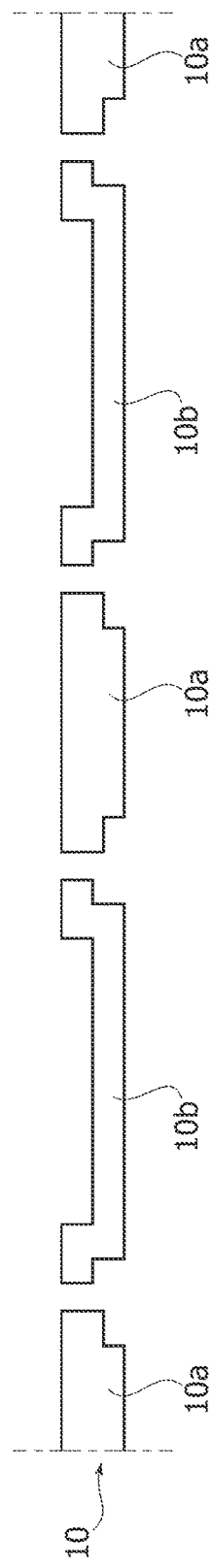

FIG. 2A is exemplary of the provision of leadframe material 10 (Cu sheet, for instance).

The designation "leadframe" (or "lead frame") is currently used (see, for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

Essentially, a leadframe comprises an array of electrically-conductive formations (leads) 10a which from an outline location extend inwardly in the direction of a semiconductor chip or die thus forming an array of electrically-conductive formations from a die pad 10b.

As conventional in the art, such a leadframe 10 may be provided in the form of a strip of notionally indefinite length where a plurality of devices is formed, with the individual devices thus formed finally separated by a final "singulation" act.

To that effect the leadframe 10 may be provided along its length with fiducials, not visible in the figure for simplicity.

Figure 2B:
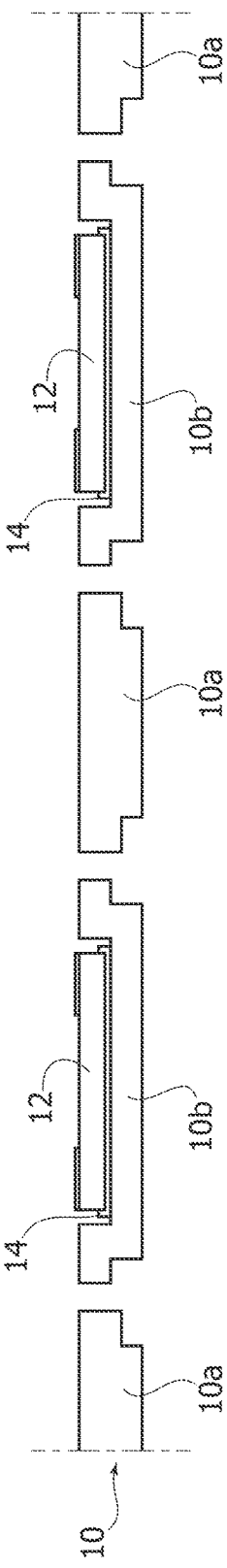

FIG. 2B is exemplary of semiconductor dice 12 being attached onto the die pads 10b in the leadframe 10. This may be via die attach adhesive 14 (DAF or standard glue dispensing, for instance), which is not expressly indicated with a reference symbol in the subsequent figures for clarity of illustration.

Figure 2C:
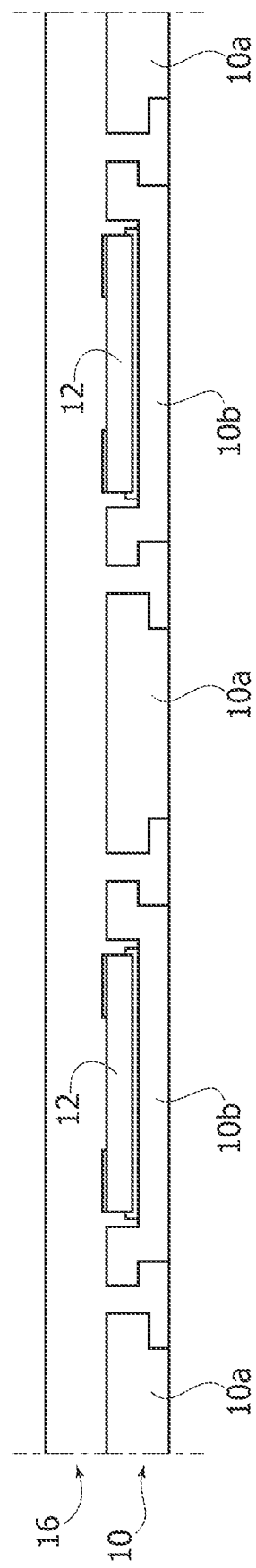

FIG. 2C is exemplary of LDS molding compound 16 being molded onto the surface resulting from the act of FIG. 2B.

In one or more embodiments, the LDS molding compound 16 may provide a (per se electrically-insulating) encapsulation of the semiconductor die 12, possibly extending into the spaces between the leads 10a and the die pad 10b in the leadframe 10.

As discussed, an LDS compound as 16 may comprise any of a broad range of LDS materials, for instance resin such as polymer thermoplastic resins like polycarbonate (PC), polycarbonate/acrylonitrile butadiene styrene (PC/ABS), acrylonitrile butadiene styrene (ABS), liquid-crystal polymer (LCP) and thermoset epoxy resins are currently available for that purpose.

Figure 2D:
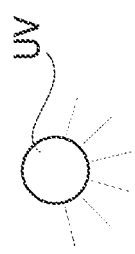
Figure 2D:
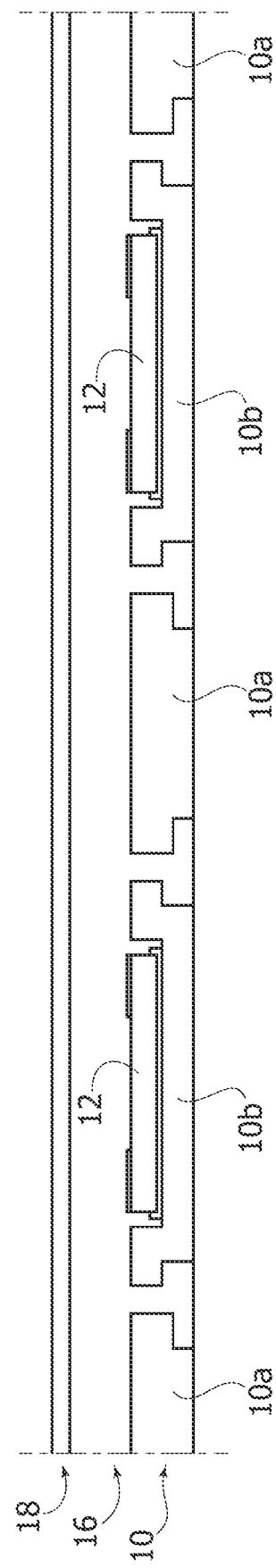

FIG. 2D is exemplary of a layer of resist material 18 being formed (deposited, for instance) onto the LDS material 16.

Use of such resist materials is conventional in the area of manufacturing semiconductor devices such as integrated circuits, which makes it unnecessary to provide a more detailed description herein.

Briefly, the designation resist applies to a layer of material which can be used to transfer a desired circuit pattern onto a substrate. Such a layer can be patterned in various ways to form a mask intended to protect certain regions of the substrate during subsequent processing steps.

In one or more embodiments as exemplified herein, the (continuous) layer 18 includes resist material which can be hardened by resorting to light exposure (from a source designated UV in FIG. 2D) after being formed onto the LDS material 16.

In one or more embodiments, the layer of resist material 18 may be selected out of solder resist, epoxy material, adhesive tape and photoresist material: those of skill in the art will otherwise easily appreciate that these are merely exemplary, non-mandatory options.

DuPont Riston 200 Series is exemplary of resist material which may be advantageously used in one or more embodiments.

FIG. 2E is exemplary of electrically-conductive formations structured in the LDS material 16 with "activation" laser beam energy applied as exemplified by L.

As exemplified herein, such electrically-conductive formations comprise lines or traces 20a at the surface of the compound 16 and vias 20b extending through the compound 16 between opposed surfaces of the compound layer.

In one or more embodiments as exemplified herein, lines or traces 20a and vias 20b are structured by laser beam energy traversing the resist layer 18.

For instance, this may involve the (at least partial) evaporation or ablation of the layer of resist material 18 under the action of the laser beam energy.

In one or more embodiments as exemplified herein, such laser beam etching of the layer of resist material 18 will result in trenches (slits or grooves) or holes being formed in the resist material 18 which are self-aligned with the lines/vias structured in the LDS material 16.

FIG. 2F is exemplary of metallization via Cu electroplating of lines 20a and/or vias 20b to facilitate their electrical conductivity.

In one or more embodiments, the thickness of the formed Cu layer may be 50 to 70 μm.

As exemplified in FIG. 3, the (self)alignment of:
the side walls of trenches (slits or grooves) or holes formed by the action of laser beam (as exemplified at L in FIG. 2E) in the resist material 18,
the lines/vias structured in the LDS material compound 16 resulting from the act of FIG. 2E, facilitates preventing Cu growth laterally of lines 20a and/or vias 20b, so that electrically-conductive formations (Cu formations) 22 with substantially vertical edges are obtained.

This result is highlighted on the left-hand side of FIG. 3 by way of direct comparison with the conventional solution of FIG. 1, which is once again reproduced on the right-hand side of FIG. 3.

The representation on the left-hand side of FIG. 3 also shows that, in one or more embodiments, the electrically-conductive formations 22 may end up by having a front (upper) surface which is substantially level with the surface of the resist layer 18 (with no growth-also-over the resist surface).

This may facilitate forming electrically-conductive formations 22 which fill the volume formed in the resist layer 18, thus having a thickness which may reach up to the height/depth of the trenches or holes formed by the action of laser beam.

Figure 2G:
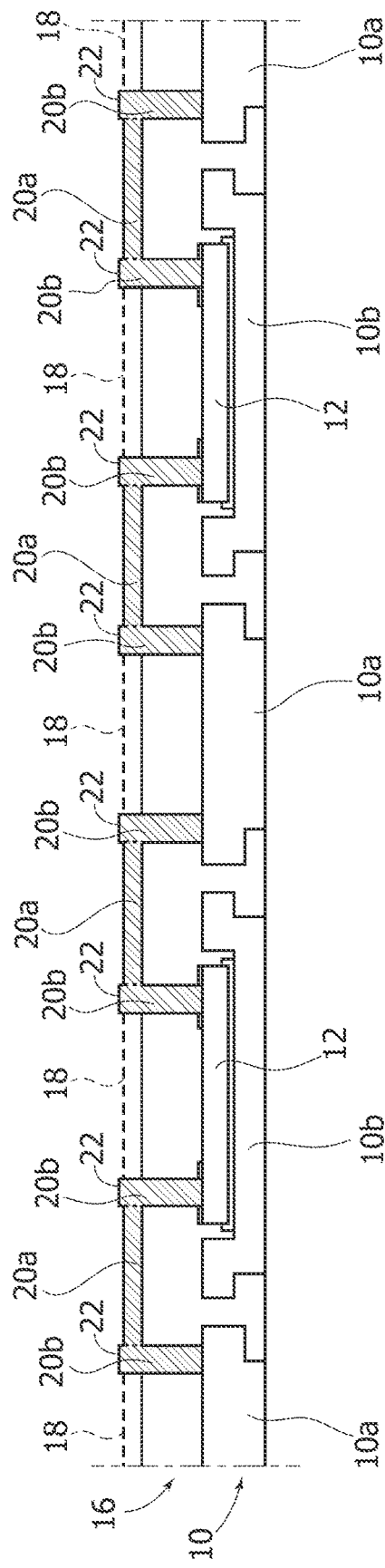

FIG. 2G is exemplary of possible (non-mandatory) removal of the layer of resist material 18, which can be performed with any process known to those of skill in the art for that purpose.

Figure 2H:
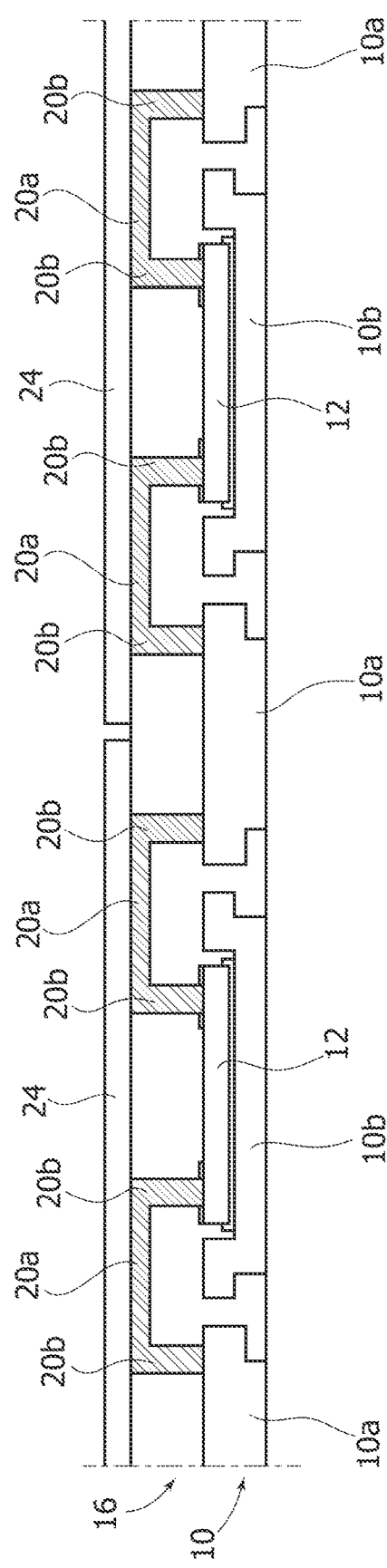

FIG. 2H is exemplary of possible further steps in completing the packaging of the product 100 (possibly after resist removal as exemplified in FIG. 2G).

For instance, the layer designated 24 in FIG. 2H may be exemplary of (further) package molding compound molded onto the assembly of FIG. 2F (possibly after resist removal as exemplified in FIG. 2G). In one or more embodiments, the (further) mass of package molding compound 24 may include conventional (that is, non-LDS) molding compound such as an epoxy molding compound (EMC).

The layer designated 24 in FIG. 2H may be likewise exemplary of stencil printing of solder coat (around 100 μm thickness, for instance) onto the assembly of FIG. 2F (again possibly after resist removal as exemplified in FIG. 2G).

Figure 2I:
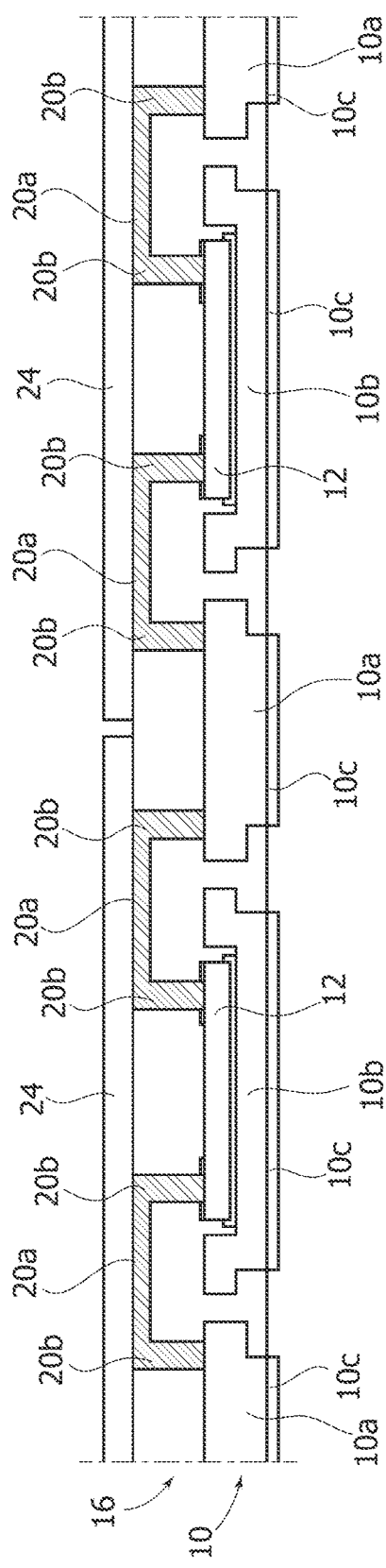

FIG. 2I is exemplary of possible metal plating (tin plating, for instance) 10c formed at the bottom (back) surface of the leadframe 10.

Figure 2J:
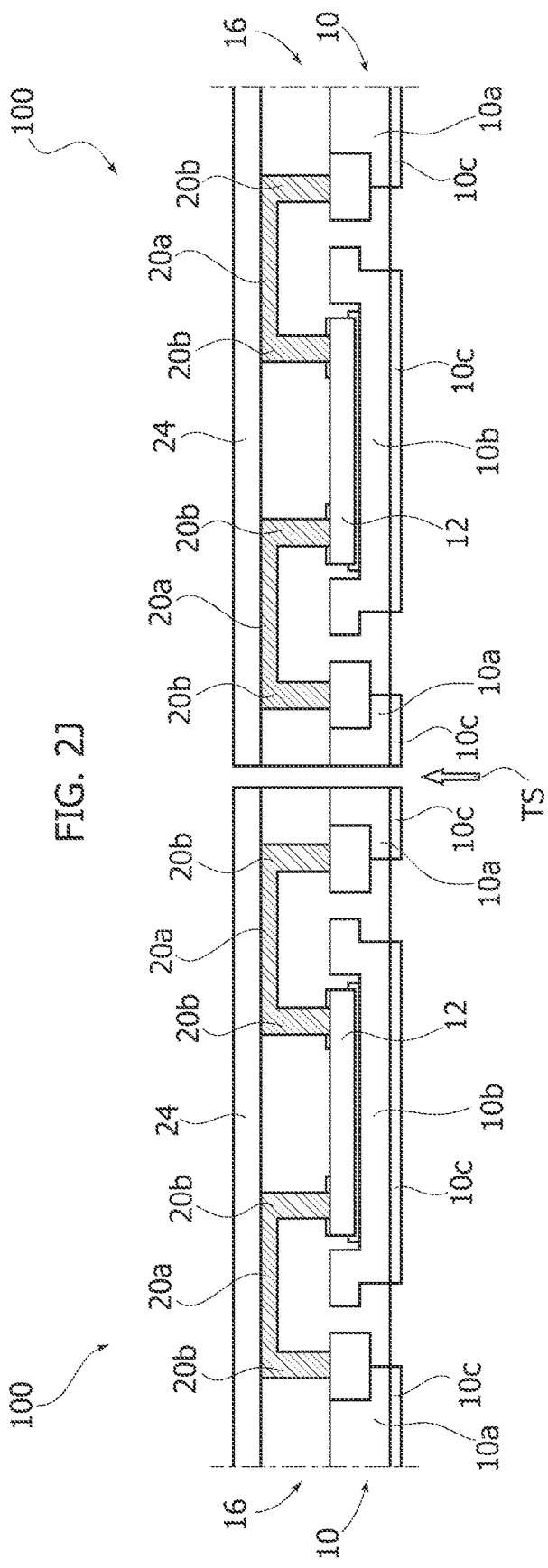

FIG. 2J is exemplary of an act of singulation via a conventional singulation tool as exemplified at TS to form individual semiconductor devices 100.

A method as exemplified herein may comprise:
molding laser direct structuring material (for instance, 16) onto at least one semiconductor die (for instance, 12) to provide at least partial encapsulation thereof,
forming resist material (for instance, 18) on the laser direct structuring material,
applying laser beam energy (for instance, L) to the laser direct structuring material through the resist material formed thereon, wherein said laser beam energy produces mutually aligned patterns of electrically-conductive formations (for instance 20a, 20b) structured in the laser direct structuring material and etched-out portions of the resist material, said etched-out portions of the resist material leaving said electrically-conductive formations uncovered and having lateral walls sidewise of said electrically-conductive formations, and
forming electrically-conductive material (for instance, 22) on said electrically-conductive formations in the laser direct structuring material at said etched-out portions of the resist material, wherein said electrically-conductive material has lateral confinement surfaces at said lateral walls of said etched-out portions of the resist material.

In a method forming the etched-out portions, which may be formed by removing portions of the resist material 18 includes forming openings at locations along the resist material 18 where the etched-out portions have been removed.

In a method as exemplified herein, forming electrically-conductive material on said electrically-conductive formations structured in the laser direct structuring material may comprise growing electrically-conductive material at said etched-out portions of the resist material.

In a method as exemplified herein, growing electrically-conductive material at said etched-out portions of the resist material may comprise immersing the laser direct structuring material and the resist material formed thereon having mutually aligned patterns of electrically-conductive formations and etched-out portions in a metal-containing bath.

In a method as exemplified herein, growing electrically-conductive material at said etched-out portions of the resist material may comprise:
growing a first, thin layer of electrically-conductive material on said electrically-conductive formations in the laser direct structuring material,
growing a second, thick layer of electrically-conductive material on said first, thin layer of electrically-conductive material.

A method as exemplified herein may comprise:
growing said first layer of electrically-conductive material via an electroless bath, and
growing said second layer of electrically-conductive material via galvanic growth.

In a method as exemplified herein, said electrically-conductive material formed on said electrically-conductive formations structured in the laser direct structuring material may comprise copper.

In a method as exemplified herein, said resist material may be selected out of solder resist, epoxy material, adhesive tape and photoresist material.

In a method as exemplified herein, said electrically-conductive formations structured in the laser direct structuring material may comprise:
electrically-conductive lines (for instance, 20a) over the laser direct structuring material, and/or
electrically-conductive vias (for instance, 20b) through the laser direct structuring material.

A method as exemplified herein may comprise removing said resist material formed on the laser direct structuring material subsequent to forming said electrically-conductive material on said electrically-conductive formations in the laser direct structuring material at said etched-out portions of the resist material.

A device (for instance, 100) as exemplified herein may comprise:
laser direct structuring material molded onto at least one semiconductor die to provide at least partial encapsulation thereof, a pattern of laser-beam activated, electrically-conductive formations structured in the laser direct structuring material, and electrically-conductive material formed on said electrically-conductive formations structured in the laser direct structuring material, wherein said electrically-conductive material formed on said electrically-conductive formations has lateral confinement surfaces aligned with said pattern of laser-beam activated, electrically-conductive formations in the absence of lateral growth with respect thereto.

Without prejudice to the underlying principles, the details and the embodiments may vary, even significantly, with respect to what has been described by way of example only without departing from the scope of the embodiments.

The extent of protection is determined by the annexed claims.

The various embodiments described above can be combined to provide further embodiments. All of the U.S. patents, U.S. patent application publications, U.S. patent applications, foreign patents, and foreign patent applications listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a laser direct structuring material on at least one semiconductor die, the laser direct structuring material at least partially encapsulates the at least one semiconductor die, the laser direct structuring material includes a surface that faces away from the at least one semiconductor die;
a pattern of laser-beam activated, electrically-conductive formations structured in the laser direct structuring material; and
an electrically-conductive material on the electrically-conductive formations structured in the laser direct structuring material, wherein the electrically-conductive material is on the electrically-conductive formations, the electrically-conductive material has lateral confinement surfaces that abut the electrically-conductive formations, and the electrically-conductive material protrudes from the surface of the laser direct structuring material;
a resin fully covers the surface of the laser direct structuring material and fully covers the electrically-conductive material, and the resin along with the laser direct structuring material fully encapsulates the electrically-conductive formations and the electrically-conductive material.

2. The device of claim 1, wherein the surface of the laser direct structuring material is void of the electrically-conductive material.

3. The device of claim 1, further comprising a leadframe including a die pad coupled to the at least one semiconductor die and a lead spaced apart from the die pad, the lead being coupled to the die by the electrically conductive material.

4. The device of claim 1, wherein the die pad includes a recess extends into the die pad, and the at least one semiconductor die coupled to the die pad is positioned within the recess.

5. A device, comprising:
a first side and a second side opposite to the first side;
a leadframe at the first side, the leadframe including:
a die pad having a recess extending into the die pad; and
a lead spaced apart from the die pad;
a die positioned within the recess and coupled to the die pad;
a first resin covers the die pad, the lead, and the die, the first resin includes a surface facing away from the first side;
an electrically conductive structure extending into the first resin, the electrically conductive structure having a U-shape, the electrically conductive structure coupling the die to the lead, the electrically conductive structure being at the second side, the electrically conductive structure includes a plurality of sidewalls that protrude from the surface of the first resin, and the electrically conductive structure is spaced apart from the surface of the first resin; and
a second resin on the surface of the first resin and the electrically conductive structure, the second resin along with the first resin fully encapsulates the electrically-conductive structure.

6. The device of claim 5, wherein the electrically conductive structure having the U-shape further comprises:
a first portion extending in a first direction, the first portion being coupled to the die;
a second portion extending in the first direction, the second portion spaced apart from the first portion, the second portion being coupled to the lead; and
a third portion extending in a second direction transverse to the first direction, the third portion extending from the first portion to the second portion, the third portion couples the first portion to the second portion.

7. The device of claim 5, wherein the plurality of sidewalls are substantially orthogonal to the surface of the first resin and the surface of the first resin is devoid of the electrically conductive structure.

8. The device of claim 5, wherein the first resin is a laser direct structuring resin and the second resin is a molding resin.

9. The device of claim 5, wherein the first resin is a laser direct structuring resin.

10. The device of claim 5, wherein:
the first resin further comprises a first outer surface; and
the electrically conductive structure further comprises a second outer surface exposed from the first resin, the second outer surface being laterally adjacent to the first outer surface.

11. The device of claim 10, wherein the second resin covers the first outer surface and the second outer surface.

12. A device, comprising:
a first side and a second side opposite to the first side;
a leadframe at the first side, the leadframe including:
a die pad having a first recess extending into the die pad; and
a lead spaced apart from the die pad;
a die positioned within the first recess and coupled to the die pad;
a first resin covers the die pad, the lead, and the die, the first resin including:

a surface facing away from the first side and at the second side;

a second recess extends into the surface of the first resin and terminates within the first resin before reaching the leadframe and the first side; and a first sidewall adjacent to the second recess;

an electrically conductive structure within the second recess in the first resin, the electrically conductive structure includes a first end within the second recess in the first resin and a second end spaced outwardly from the surface of the first resin, the first end is opposite to the second end, and a second sidewall of the electrically conductive structure extends from the first end to the second end and is aligned with the first sidewall of the first resin and a second resin fully covers the second end of the electrically conductive structure, and the second resin along with the first resin fully encapsulates the electrically conductive structure.

13. The device of claim 12, further comprising a resist layer on the surface of the first resin and covering the second sidewall of the electrically conductive structure.

14. The device of claim 12, wherein the first resin is a laser direct structuring resin doped with a conductive additive material.

15. The device of claim 12, wherein the second resin is on the surface of the first resin and covers the second sidewall of the electrically conductive structure.

16. The device of claim 15, wherein the second resin is a non-laser direct structuring molding compound.

17. The device of claim 12, wherein the electrically conductive structure has a U-shape.

18. The device of claim 17, wherein the electrically conductive structure with the U-shape includes:

a first portion extending in a first direction through the first resin to the die, the first portion being coupled to the die;

a second portion extending in the first direction to the lead, the second portion spaced apart from the first portion, the second portion being coupled to the lead; and a third portion extending in a second direction transverse to the first direction, the third portion extending from the first portion to the second portion, the third portion couples the first portion to the second portion, the third portion is within the second recess in the first resin.

19. The device of claim 12, wherein:

the first resin further includes a third sidewall opposite to the first sidewall;

the second recess in the first resin is between the first sidewall and the third sidewall; and the electrically conductive structure further includes a fourth sidewall opposite to the second sidewall, the fourth sidewall is aligned with the second sidewall of the first resin.

20. The device of claim 19, wherein:

the fourth sidewall of the electrically conductive structure extends from the first end of the electrically conductive structure to the second end of the electrically conductive structure; and the second end extends from the second sidewall to the fourth sidewall.

21. The device of claim 19, wherein:

the electrically conductive structure further includes:

a first dimension extending from the second sidewall to the fourth sidewall; and a second dimension extending from the first sidewall to the third sidewall, and the second dimension is equal to the first dimension;

the second end of the electrically conductive structure has the first dimension.

* * * * *